(12) United States Patent
Burri et al.

(10) Patent No.: US 6,407,629 B1
(45) Date of Patent: Jun. 18, 2002

(54) SAMPLE AND HOLD DEMODULATOR CIRCUIT

(75) Inventors: Michel Burri, Grand-Saconnex (CH); Christophe Landez, Toulouse (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/609,554

(22) Filed: Jun. 30, 2000

(30) Foreign Application Priority Data

Oct. 4, 1999 (EP) .............................................. 99402422

(51) Int. Cl.[7] .............................. H03D 1/00; H03D 3/00; H03D 1/22
(52) U.S. Cl. ........................ 329/347; 329/345; 455/337
(58) Field of Search ................. 329/347, 345; 455/337

(56) References Cited

FOREIGN PATENT DOCUMENTS

| EP | 0745747 A1 | * | 12/1996 |
| GB | 2100538 A | * | 12/1982 |

* cited by examiner

*Primary Examiner*—David Mis

(57) ABSTRACT

In accordance with an embodiment of the invention there is provided a sample and hold demodulator circuit (200) for use in an automotive immobilizer to recover modulation information from a received modulated carrier signal ($V_{RD}$). Sample and hold circuitry samples signals to recover the modulation information therein, and control circuitry (214) is coupled to the sample and hold circuitry for controlling operation thereof. The control circuitry includes shift register circuitry (252) for receiving a second received signal having a same frequency as a carrier frequency of the received modulated carrier signal and for producing at its outputs signals (SAMPLE, SAMPLE2, LATCH) for controlling operation of the sample and hold circuitry. The sample and hold demodulator circuit provides a single IC solution, allowing amplitude and phase demodulation to be performed with a single sample and hold circuit.

6 Claims, 2 Drawing Sheets

SAMPLE AND HOLD DEMODULATOR CIRCUIT

FIELD OF THE INVENTION

The present invention relates to sample and hold demodulator circuits and particularly, though not exclusively, to sample and hold demodulator circuits for use in automotive immobilizer applications.

BACKGROUND OF THE INVENTION

It is well known that amplitude and/or phase demodulation can be simply achieved by using a sample and hold circuit. However, this technique requires accurate knowledge of the input signal's phase shift relative to a reference clock.

Many system parameters can influence this phase shift, preventing use of fixed approximation techniques and necessitating actual measurement. The measured value must then be computed into an appropriate sampling time.

In applications such as automotive immobilizers, it is known to implement a sample and hold demodulator in a base station electronic control unit (ECU) for location in an automobile as a circuit partitioned in two parts: a front end receiver, and a calculator (typically a microcontroller). The receiver measures the phase and sends this measurement to the microcontroller via a bus. The microcontroller computes the corresponding sampling time and sends it to the receiver for beginning the demodulation.

This known implementation requires either that there is a dedicated microcontroller in the base station module, or that there are extra interfaces and wires between the base station and a remote microcontroller (e.g., in the main ECU elsewhere in the automobile).

Such an implementation therefore suffers increased cost and/or complexity.

It is an object of this invention to provide a sample and hold demodulator circuit in which the above disadvantages may be overcome or at least alleviated.

SUMMARY OF THE INVENTION

In accordance with an embodiment of the invention there is provided a sample and hold demodulator circuit for use in an automotive immobilizer to recover modulation information from a received modulated carrier signal ($V_{RD}$). Sample and hold circuitry samples signals to recover the modulation information therein, and control circuitry is coupled to the sample and hold circuitry for controlling operation thereof. The control circuitry includes shift register circuitry for receiving a second received signal having a same frequency as a carrier frequency of the received modulated carrier signal and for producing at its outputs signals for controlling operation of the sample and hold circuitry. The sample and hold demodulator circuit provides a single IC solution, allowing amplitude and phase demodulation to be performed with a single sample and hold circuit.

BRIEF DESCRIPTION OF THE DRAWINGS

In order that the present invention may be better understood, one sample and hold demodulator circuit utilising the present invention will now be described, by way of example only, with reference to the accompanying drawings in which.

DETAILED DESCRIPTION OF THE INVENTION

Figure 1:
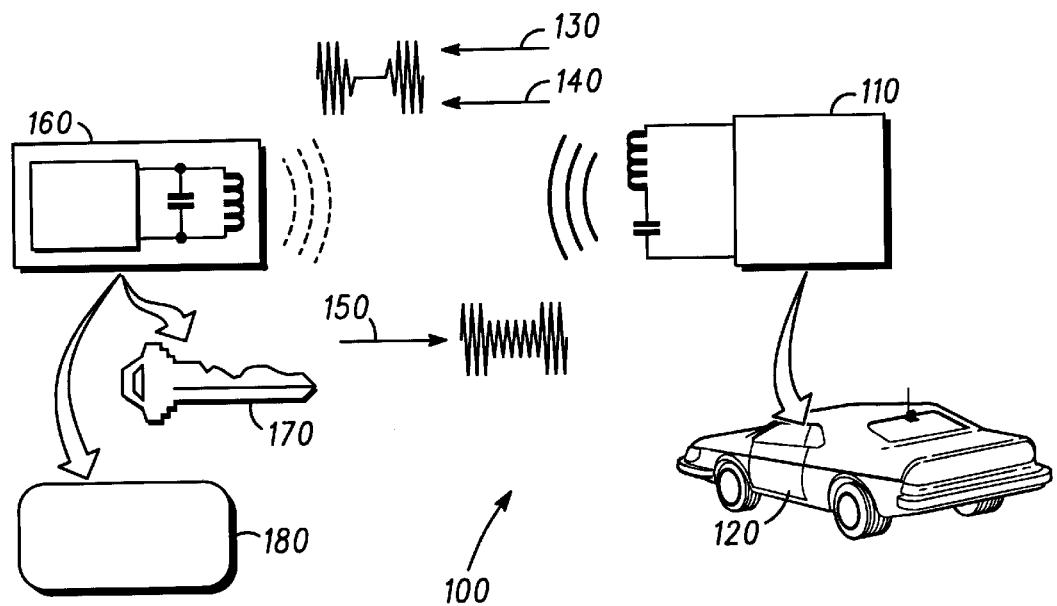
FIG. 1 is a schematic diagram showing an overview of an automotive immobiliser system.

Referring firstly to FIG. 1, an automotive immobilizer system 100 includes a base station portion 110 having an RF transceiver and located in an automobile 120 for controlling (inter alia) immobilization of the automobile. The base station transceiver 110 transmits energy 130 and data 140 to, and receives data 150 from, the RF transceiver of a tag 160 which may be embedded in a key 170 or a card 180. The immobilizer system 100 uses a carrier frequency of 125 KHz on which the data is modulated in coded form in known manner.

Figure 2:
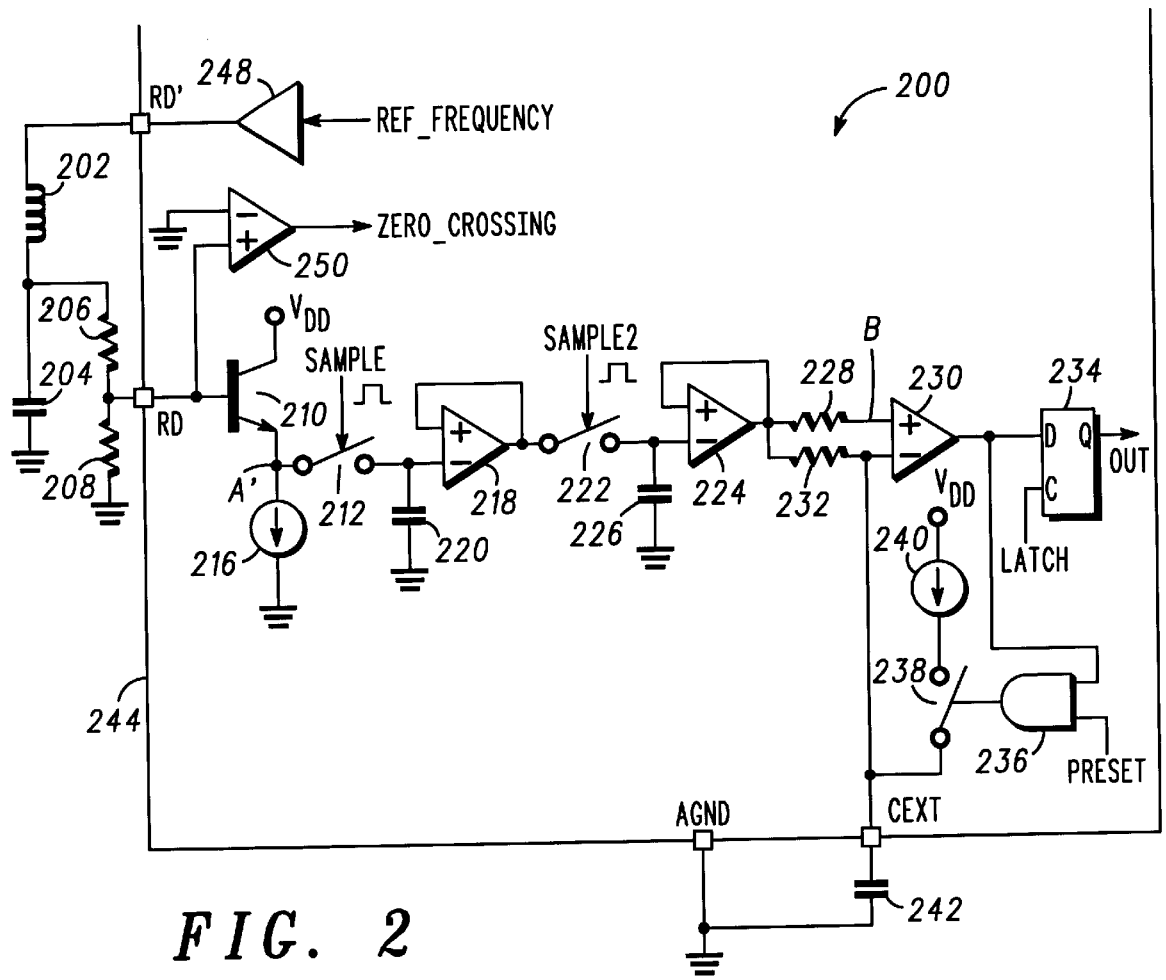
FIG. 2 is a block-schematic circuit diagram of a self-acting sample and hold demodulator circuit for fabrication in a single IC for use in the base station portion of the automotive immobilizer system of FIG. 1.
Figure 3:
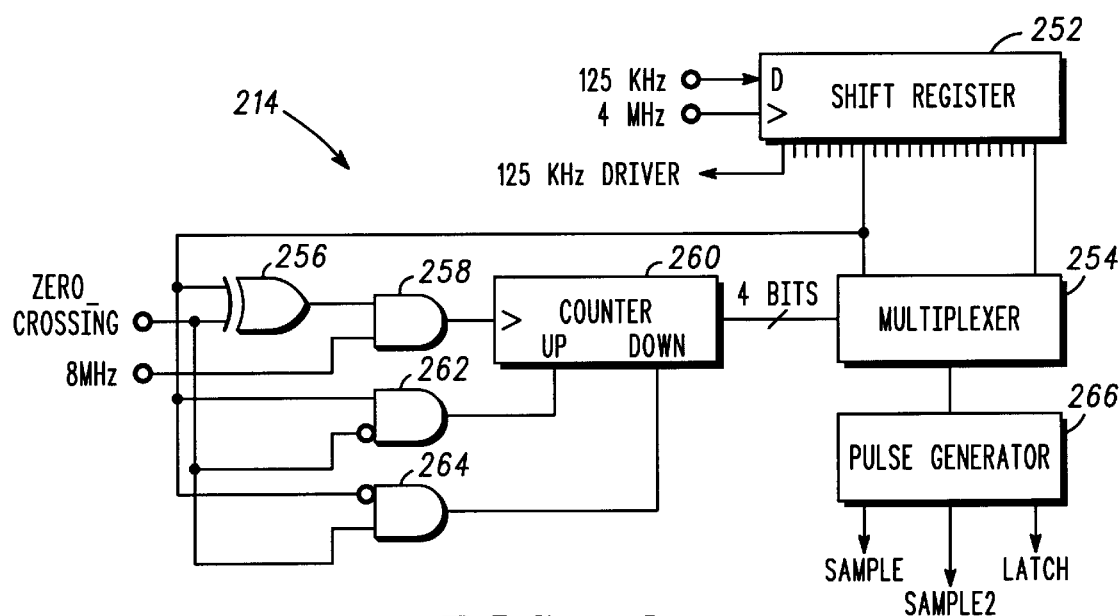
FIG. 3 is a block-schematic circuit diagram of a controller block for generating various control signals used in the circuit of FIG. 2.

Referring now also to FIG. 2, the base station portion 110 includes a sample and hold demodulator circuit 200. The sample and hold demodulator circuit 200 has an inductor coil 202 connected in series with a capacitor 204 to form a tuned circuit. A point intermediate the coil 202 and the capacitor 204 is connected to a resistance chain 206, 208. A point intermediate the resistances 206, 208 is connected to a terminal RD, which is connected to the base electrode of a bipolar npn transistor 210. The transistor 210 has its collector electrode connected to a supply voltage rail VDD, and has its emitter electrode connected to the input of a sampling switch 212 which is under the control of a sample signal SAMPLE from control block 214 (FIG. 3, described below). The emitter electrode of the transistor 210 is also connected via a current source 216 to ground. The sampling switch 212 has its output connected to the inverting input of a buffer differential amplifier 218 whose output is connected to its non-inverting input. The output of the sampling switch 212 is also connected via a capacitor 220 to ground.

The output of the buffer amplifier 218 is also connected to the input of a sampling switch 222 which is under the control of a sample signal SAMPLE2 from the control block 214 (FIG. 3, described below). The sampling switch 222 has its output connected to the inverting input of a buffer differential amplifier 224 whose output is connected to its non-inverting input. The output of the sampling switch 222 is also connected via a capacitor 226 to ground.

The output of the buffer amplifier 224 is also connected (via a resistance 228) to the non-inverting input of comparator differential amplifier 230. The output of the buffer amplifier 224 is also connected (via a resistance 232) to the inverting input of the comparator amplifier 230. The output of the comparator amplifier 230 is also connected to the "D" input of a latch 234. The latch 234 has its "C" input connected to receive a latch signal LATCH from the control block 214 (FIG. 3, described below), and from its "Q" output produces an output signal OUT which is the demodulated output of the circuit. The output of the comparator amplifier 230 is also connected to one input of a 2-input AND gate 236, whose other input is coupled to receive a PRESET input signal. The output of the AND gate 236 is connected to control a switch 238 which is coupled to connect a current source 240 between the supply voltage rail VDD and the inverting input of the comparator amplifier 230. The inverting input of the comparator amplifier 230 is also connected to node CEXT, which is connected via a capacitor 242 to ground. An automotive ground node AGND is also connected to ground.

The control block 214 (FIG. 3, described below) provides a 125 KHz reference frequency signal REF_FREQUENCY, which is applied via an amplifier 248 to a terminal RD'. The RD' terminal is connected to the inductor coil 202.

The base electrode of the transistor 210 is also connected to the non-inverting input of comparator amplifier 250 whose inverting input is connected to ground. The output of the comparator amplifier 250 provides a zero crossing signal ZERO_CROSSING to the control block 214 (FIG. 3, described below).

It will be understood that in practice all the components (except the inductor coil 202, the capacitor 204, the resistors 206 and 208 and the capacitor 242) are formed in a single integrated circuit 244. The components 202, 204, 206, 208 and 242 are provided as external components connected to the integrated circuit at the terminals RD', RD and CEXT.

Figure 4A:
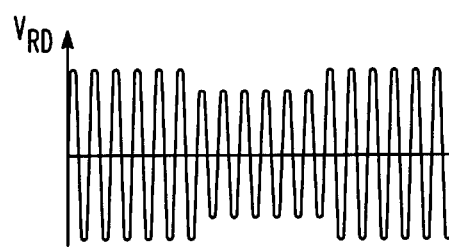
FIG. 4 shows graphic representations of various voltage waveforms occurring in use of the circuit of FIG. 2.
Figure 4B:
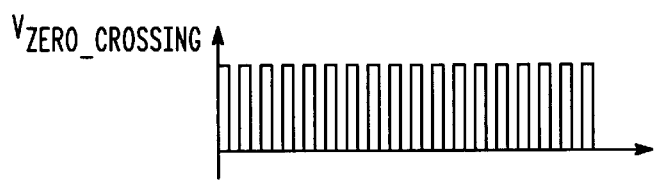
Figure 4C:
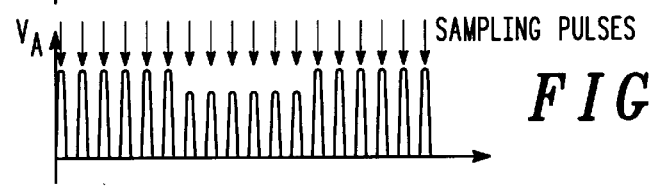
Figure 4D:
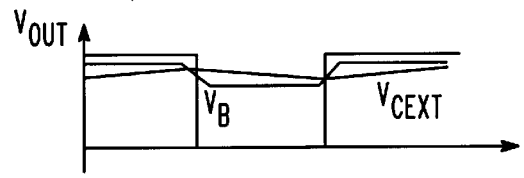

Referring now also to FIG. 4, in use of the circuit of sample and hold demodulator circuit 200 of FIG. 2, an amplitude-modulated signal $V_{RD}$ (FIG. 4A) received at the tuned circuit 202, 204 is used to produce a ZERO-CROSSING signal (FIG. 4B) and is rectified by the transistor 210 to produce a rectified signal $V_A$ (FIG. 4C). The rectified signal is sampled and held by the switch 212 and capacitor 220. This sampled and held signal is then further sampled and held by the switch 222 and capacitor 226 to produce a signal $V_B$ (FIG. 4D) which is applied to the comparator 230. The comparator 230 compares the sampled and held signal $V_B$ with the voltage $V_{CEXT}$ (FIG. 4D) held on the capacitor 242, and the result of the comparison produces a pulse signal which is representative of the modulation information in the received signal (FIG. 4A). The output signal from the comparator 230 is latched in the latch 234 to produce the demodulated circuit output signal $V_{OUT}$ (FIG. 4D).

Referring now also FIG. 3, the control block 214 has a 23-bit shift register 252 which receives a 125 KHz signal at its "D" input. The shift register 252 is clocked at 4 MHz. The shift register's "bit 0" output is connected to provide a 125 KHz REF_FREQUENCY signal to a driver circuit (not shown). Sixteen bits of the shift register's outputs from "bit 7" to "bit 22" are connected to a 16-bit multiplexer 254. The shift register's "bit 7" output is also connected to one input of an OR gate 256, another input of which is connected to receive the ZERO_CROSSING signal from the amplifier 250 of FIG. 2. The OR gate 256 has its output connected to an input of an AND gate 258, another input of which is coupled to receive an 8 MHz clock signal. The AND gate 258 has its output connected to the clock input of a 4-bit up/down counter 260. The "bit 7" output of the shift register 252 is also connected to an input of an AND gate 262, another input of which is coupled to receive invertedly the ZERO_CROSSING signal from the amplifier 250 of FIG. 2. The AND gate 262 has its output connected to the "up" input of the counter 260. The "bit 7" output of the shift register 252 is also connected invertedly to an input of an AND gate 264, another input of which is coupled to receive the ZERO_CROSSING signal from the amplifier 250 of FIG. 2. The AND gate 264 has its output connected to the "down" input of the counter 260. The 4-bit output of the counter 260 is applied to the multiplexer 254. The output of the multiplexer 254 is connected to a pulse generator 266 which produces the output control signals SAMPLE, SAMPLE2 and LATCH.

In operation of the demodulator circuit 200, the control block 214 of FIG. 3 receives the ZERO_CROSSING signal from the amplifier 250 and generates at its outputs the SAMPLE, SAMPLE2 and LATCH signals which control the circuit. The first output ("bit 0") of the shift register 252 provides the 125 KHz reference signal REF_FREQUENCY.

In the ideal case, the demodulator input signal (received by the tuned circuit 202, 204 from the tag 160) is 90° phase-shifted with respect to the reference frequency signal. Therefore, ideally, the ZERO_CROSSING signal corresponds to the 9th output ("bit 8") of the shift register 252. In other cases, the zero crossing may vary, coming either earlier or later than the "bit 8" output. To accommodate this possible variance, the up/down counter 260 (operating at a counter frequency of 8 MHz) gives a signed value to this phase difference with an accuracy of +/−125 ns.

It can be demonstrated that the best sampling time is twice the delay between zero crossing and the "bit 8" output of the shift register 252. Therefore, the SAMPLE signal can be generated from the 23-bit shift register 252 clocked at half the frequency of the counter 260, i.e., 8 MHz/2=4 MHz. However, in practice the following delays have to be taken into account:

the zero crossing comparator delay td1 (typically 50 ns);

the synchronisation delay td2 between the zero crossing and a synchronisation signal (the ZERO_CROSSING signal has to be re-synchronised to avoid meta-stability problems) resulting in td2 being in the range from 62.5 ns to 187.5 ns; and an 8 MHz clock period between the synchronisation signal and the clock signal of the counter 260 producing a delay td3 of 125 ns.

This leads to a total delay td in the range from 237.5 ns to 362.5 ns. Thus, in order to allow for this delay, the synchronisation signal must be compared with the "bit 9" output of the shift register 252 rather than its "bit 8" output.

As the sampling phase corresponds to the falling edge of the SAMPLE signal which is 500 ns long, doubling the phase shift delay is achieved as shown in the following table:

| Counter Output [0:3] | Multiplexer Output "bit n" | Sampling Phase (°) |
| --- | --- | --- |
| 0000 | 14 | 11.25 |
| 0001 | 15 | 22.5 |
| 0010 | 16 | 33.75 |
| 0011 | 17 | 45 |
| 0100 | 18 | 56.25 |
| 0101 | 19 | 67.5 |
| 0110 | 20 | 78.75 |
| 0111 | 21 | 90 |
| 1000 | 6 | −78.75 |
| 1001 | 7 | −67.5 |
| 1010 | 8 | −56.25 |
| 1011 | 9 | −45 |
| 1100 | 10 | −33.75 |
| 1101 | 11 | −22.5 |
| 1110 | 12 | −11.25 |
| 1111 | 13 | 0 |

Although only generation of the SAMPLE signal has been described above, it will be understood that the other outputs SAMPLE2 (which has the same pulse width as the SAMPLE signal) and LATCH have fixed delays relative to the SAMPLE signal, and so are easily produced based on the timimg of the SAMPLE signal described above.

It will be understood that the sample and hold circuit 200 described above is self-synchronous and provides a single IC solution, allowing amplitude and phase demodulation to be performed with a single sample and hold circuit which can be used in the base station module of an automotive immobilizer system without requiring a dedicated microcontroller in the base station module or without requiring extra interfaces or wires between the base station module and a main electronic control unit elsewhere in the automobile.

What is claimed is:

1. A demodulator circuit for recovering modulation information from a received modulated carrier signal, the circuit comprising:

sample and hold means for sampling the received signal to recover the modulation information therein, and control means coupled to the sample and hold means for controlling operation thereof, the control means comprising shift register means for receiving a second received signal having a same frequency as a carrier frequency of the received modulated carrier signal and for producing at its outputs signals for controlling operation of the sample and hold means.

2. A demodulator circuit as claimed in claim 1 wherein the control means further comprises:

counter means coupled to receive an output from the shift register means;

multiplexer means coupled to receive outputs from the shift register means and from the counter means; and signal forming means coupled to receive an output from the multiplexer means to produce signals for controlling operation of the sample and hold means.

3. A demodulator circuit as claimed in claim 2 wherein the signal forming means comprises pulse generating means.

4. A demodulator circuit as claimed in claim 2 wherein the shift register means comprises a 23-bit shift register, the counter means comprises a 4-bit up/down counter and the multiplexer comprises a 16-bit multiplexer.

5. A demodulator circuit as claimed in claim 1 wherein the circuit is formed in a single integrated circuit.

6. An automotive immobilizer unit including a demodulator circuit as claimed in claim 1.

* * * * *